(12) United States Patent
Almgren

(10) Patent No.: US 8,335,481 B2
(45) Date of Patent: Dec. 18, 2012

(54) LOAD MODULATION ARRANGEMENT

(75) Inventor: Bjorn Almgren, Knivsta (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 242 days.

(21) Appl. No.: 12/744,242

(22) PCT Filed: Dec. 5, 2007

(86) PCT No.: PCT/SE2007/050941
§ 371 (c)(1),
(2), (4) Date: May 21, 2010

(87) PCT Pub. No.: WO2009/072944
PCT Pub. Date: Jun. 11, 2009

(65) Prior Publication Data
US 2010/0261444 A1 Oct. 14, 2010

(51) Int. Cl.
*H04B 1/04* (2006.01)

(52) U.S. Cl. .............. 455/120; 455/107; 455/575.7

(58) Field of Classification Search .......... 455/91, 455/120, 107, 106, 575.7, 271, 270, 275, 455/291, 292; 333/175
See application file for complete search history.

(56) References Cited

U.S. PATENT DOCUMENTS

| | | | |
|---|---|---|---|
| 5,602,558 A | 2/1997 | Urakami et al. | |
| 5,771,026 A | 6/1998 | Stengel, Jr. et al. | |
| 6,356,149 B1 * | 3/2002 | Stengel et al. | 455/120 |
| 7,248,108 B2 * | 7/2007 | Fratti | 333/175 |
| 7,420,416 B2 * | 9/2008 | Persson et al. | 330/149 |
| 7,936,213 B2 * | 5/2011 | Shin et al. | 330/124 R |
| 2002/0093383 A1 | 7/2002 | Thompson | |
| 2003/0030504 A1 | 2/2003 | Dixit et al. | |
| 2004/0000948 A1 | 1/2004 | Stengel et al. | |
| 2010/0052779 A1 * | 3/2010 | Shin et al. | 330/124 R |

FOREIGN PATENT DOCUMENTS

| | | |
|---|---|---|
| EP | 0 637 131 A1 | 2/1995 |
| EP | 1 168 608 A2 | 1/2002 |
| EP | 1 603 186 A1 | 12/2005 |

OTHER PUBLICATIONS

International Search Report dated Aug. 11, 2008 (4 pages).
International Preliminary Report on Patentability dated Mar. 1, 2010 (6 pages).
Lépine et al., "A Load Modulated High Efficiency Power Amplifier," Proceedings of the 36th European Microwave Conference, Sep. 2006, pp. 411-414.
International Search Report, PCT Application No. PCT/SE2007/050941, Jan. 12, 2012.

* cited by examiner

Primary Examiner — Lana N Le
(74) Attorney, Agent, or Firm — Myers Bigel Sibley & Sajovec, P.A.

(57) ABSTRACT

The present invention concerns a load modulation arrangement adapted to be connected to an amplifying device. The load modulation arrangement comprises a first reactive element, a second reactive element and at least one variable capacitive element. Further, the load modulation arrangement comprises a quarter wave transforming element adapted to be connected to the first reactive element. The present invention also concerns a method for load modulation, a wireless transceiver and a radio transmission device.

18 Claims, 3 Drawing Sheets

LOAD MODULATION ARRANGEMENT

TECHNICAL FIELD

The present invention relates to the field of load modulation arrangements. More particularly the present invention relates to a load modulation arrangement as well as a method, a wireless transceiver and a radio transmission device comprising such a load modulation arrangement.

BACKGROUND

The rapid development of the telecommunications industry have made wireless handheld devices like cell phones, pagers, two-way messaging devices, etc. massively popular, creating a need for new electronic components and circuits in both mobile and base station systems as competition drives the introduction of expanded capabilities.

Radio frequency power amplifiers contribute to the power consumption in the communications networks. One reason for this is the complexity of wireless communication networks, with intense baseband signal processing. The major source of power consumption in a base station is the base stations power amplifiers. The high power consumption of the power amplifiers is mainly due to low mean efficiency where a lot of the input power is converted into heat. This requires both costly and space demanding arrangements to allow for sufficient cooling of the system.

Also, the power consumption of the system reflects on other aspects such as battery backup systems and the operators cost of power over the lifetime of the radio base station. All extra means needed to compensate for high power consumption and low efficiency will accumulate on the end customer's price for the base station.

The low efficiency of the power amplifier is due to the amplifier working under backed off conditions for most of the time. This is because a signal according to e.g. WCDMA has a high peak to average ratio. Inherently the efficiency of an amplifier is at its best when the amplifier is working close to saturation. For backed off conditions, the efficiency decays very fast with reduced output power.

Efficiency in back off denotes efficiency when an amplifier is used below its maximum available output power. Back off is the difference in decibels between actual used output power and the maximum available output power of the amplifier.

Thus, to reduce operating costs of base stations and extend battery life in mobile units, there is a need to develop new amplifiers to replace the traditionally inefficient, power wasting, elderly designs currently in use.

Many contemporary base station amplifiers employ complex techniques to realize amplifiers with a high degree of linearity over a broad frequency range. Unfortunately those solutions have a low efficiency when working in power back off.

Handset power amplifiers also suffer from efficiency problems, often more critical than those for base stations as the power supply for mobile user equipment is strictly limited. Today's smaller, faster and more effective portable electronics demand high power with minimized losses.

Load modulation networks have been suggested as feasible means of maintaining the efficiency of a power amplifier at reduced output power. This may be useful when the amplifier works on signals with a high peak to average signal amplitude, for example WCDMA signals.

An important characteristic of a load modulation network is the ratio of input impedance change in relation to the change of the tuning device. This will set the dynamic range of the load modulation network for a given tuning device range. Designing the load modulation network with high dynamic range will severely deteriorate the bandwidth for a Pi shaped load modulation network. A T-shaped network has a superior bandwidth under all circumstances, compared with a Pi shaped network.

The bandwidth of the load modulation network can be substantially increased by replacing the Pi shaped network with a T shaped network. The names Pi shaped network and T shaped network refer to the shapes of the respective load modulation networks.

However, the T shaped network has a relation of network input impedance to tuning device capacitance inverse to that of the Pi network. This inverse relation of input impedance to tuning device capacitance creates some major drawbacks using a T shaped network. Some examples of such major drawbacks are very high power dissipation in the tuning device and a very limited dynamic range, a few decibels (dB). The high power dissipation is due to high values of Radio Frequency (RF) voltage at the tuning element node simultaneous as large values of capacitance. The limitation in dynamic range is due to the same mechanism. The bias voltage to the tuning device can not be set to lower values, i.e. large capacitance values since this would give a reverse voltage over the tuning device by the peaks of the Radio Frequency voltage. This could potentially destroy the tuning device, or give rise to severe distortion.

SUMMARY

The present invention aims at obviating or reducing at least some of the above mentioned disadvantages associated with existing technology.

It is an object of the present invention to provide a load modulation network with improved bandwidth and/or efficiency.

The object is achieved by a load modulation arrangement adapted to be connected to an amplifying device. The load modulation arrangement comprises a first reactive element, a second reactive element and at least one variable capacitive element. Further, the load modulation arrangement comprises a quarter wave transforming element adapted to be connected to the first reactive element.

The object is also achieved by a method for load modulation in an arrangement. The arrangement is adapted to be connected to an amplifying device. The load modulation arrangement comprises a first reactive element. Further, the load modulation arrangement comprises a second reactive element. Further yet, the load modulation arrangement comprises at least one variable capacitive element. The method also comprises the step of connecting a quarter wave transforming element to the first reactive element.

The load modulation arrangement may with advantage be provided in a wireless transceiver as well as in a radio transmission device such as a wireless access point or a wireless terminal.

Thanks to the application of the quarter wave transforming element, the power loss in the load modulation arrangement could be minimized on the at least one variable capacitive element, as the input impedance looking into the network is high and results in a low current and therefore a small RF voltage over the tuning capacitor when the value of the capacitor is large. If the capacitance on the at least one variable capacitive element is small, it results in a low input impedance looking into the network and thus a large current and a large RF voltage swing over the tuning capacitor. However, in this situation the value of the tuning capacitor is small and thus the loss of power in the same is small.

By using a T shape network in conjunction with a quarter wave transforming element the problems with dynamic range and power dissipation for T networks are solved. Thus a load modulation arrangement with a bandwidth far better than a Pi shaped network is achieved.

An advantage of the present device is that an improved efficiency is reached, which saves energy resources.

BRIEF DESCRIPTION OF THE DRAWINGS

The present invention will now be described more in detail in relation to the enclosed drawings, in which.

DETAILED DESCRIPTION

The invention is defined as a load modulation arrangement which may be put into practice in the embodiments further described below.

Figure 1A:
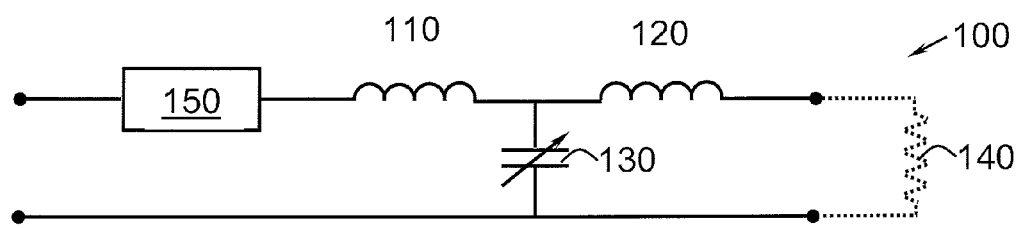
FIG. 1a is a block diagram illustrating embodiments of a load modulation network.

FIG. 1a illustrates a load modulation arrangement 100, such as a load modulation network, according to the present solution. The load modulation arrangement 100 may according to some embodiments be represented by a T load modulation network. The load modulation arrangement 100 is adapted to be connected to an amplifying device (not shown). The amplifying device may be embodied by any arbitrary type of amplifier, such as e.g. a power amplifier of class A, AB, B, C, D, E, F or S, or hybrids between these or other classes of power amplifiers. However, the load modulation arrangement 100 may with certain advantage be used for switched power amplifiers, such as amplifiers of class D, E and F. The power amplifier has a power output which may be coupled to the load modulation arrangement 100 in order to provide an amplified signal to the load modulation arrangement 100.

The amplifying device may be based on or comprise a wide range of transistors or switching units, such as e.g. Insulated Gate Bipolar Transistor (IGBT), Metal—Oxide—Semiconductor Field-Effect Transistor (MOSFET), junction gate field-effect transistor (JFET), field-effect transistor FET, LDMOS transistors, GaAs transistors, GaAs MESFET, bipolar junction transistor, Gallium-Nitride High Electron Mobility Transistor (GaN-HEMT), valves or PNP-transistors etc.

The load modulation arrangement 100 is further adapted to be connected to a load 140. The load 140 may be resistive or may include both resistance and reactance. The load 140 may further be fixed.

Figure 1B:
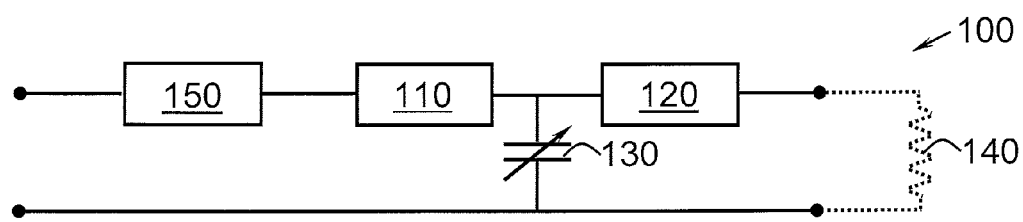
FIG. 1b is a block diagram illustrating some other embodiments of a load modulation network.

Also FIG. 1b illustrates a load modulation arrangement 100, such as a load modulation network, according to the present solution. The load modulation arrangement 100 further comprises a first reactive element 110, a second reactive element 120 and at least one variable capacitive element 130. The first reactive element 110 and/or the second reactive element 120 may be represented by an inductor, according to some embodiments as illustrated in FIG. 1a. In some embodiments, the first reactive element 110 and/or the second reactive element 120 may be represented by a transmission line as illustrated in FIG. 1b. Further, according to some embodiments, the first reactive element 110 and/or the second reactive element 120 may be represented by reactive elements of different types, such as e.g. one transmission line and one inductor.

The at least one variable capacitive element 130 may according to some embodiments be represented by a transistor output capacitance.

The at least one variable capacitive element 130 may according to some embodiments be a tunable capacitor or variable capacitor, e.g. comprising, as a non limiting example, a transistor output capacitance, a varactor, a Micro-Electro-Mechanical Systems (MEMS) capacitor or a barium strontium titanate tunable capacitance.

The at least one variable capacitive element 130 may according to some embodiments may comprise just one variable capacitive element 130. The at least one variable capacitive element 130 may however according to some other embodiments comprise a plurality of variable capacitive elements 130, such as e.g. two variable capacitive elements 130. According to these embodiments, the plurality of variable capacitive elements 130 may be connected e.g. in series or in parallel to the arrangement 100.

According to some embodiments, the load modulation arrangement 100 may be adapted such that the voltage over the variable capacitive element 130 decreases for increasing values of capacitance of the variable capacitive element 130, and vice versa.

According to some embodiments, the load modulation arrangement 100 may be adapted such that the RF voltage amplitude over the variable capacitive element 130 decreases for increasing value of capacitance of the capacitive element 130, and vice versa.

According to some embodiments, the at least one variable capacitive element 130 may be represented by a barium-strontium-titanate tunable capacitance. This technique is built on materials where the relative permittivity of the dielectric is a function of applied bias voltage. This may also be used for a tunable quarter wave transforming element 150.

However, according to some embodiments, the at least one variable capacitive element 130 may comprise a transistor and/or a diode and/or a Micro-Electro-Mechanical Systems (MEMS) component and/or a variable dielectric material and/or a piezo-electrical device.

The at least one variable capacitive element 130 may according to some embodiments be represented by a varactor diode.

A Varactor or varicap is a diode in which the junction capacitance is used with the diode reverse biased. The junction capacitance may be controlled by changing the reverse bias voltage. Depending on doping profile, the characteristics of the capacitance as a function of bias voltage may be controlled. On die level, the quality factor of the varactor is set by the series resistance where the size of the P-N junction is one contributing factor.

The load modulation arrangement 100 comprises a quarter wave transforming element 150 adapted to be connected to the first reactive element 110. The quarter wave transforming element 150 may according to some embodiments be represented by a quarter wavelength transmission line and may be used as e.g. an impedance inverter.

The quarter wave transforming element 150 is a device or circuit that transforms its load impedance half a turn in the smith chart around the characteristic impedance of the transformer itself. Thus it has an input impedance inversely proportional to the load impedance. Thus the normalized input impedance equals the normalized load admittance. The quarter wave transforming element 150 may according to some embodiments comprise a transmission line with the length set equal to λ/4, where λ is the wave length.

This arrangement transforms the input impedance to:

$$Zin = \frac{Z^2}{Znet}$$

Where Zin is the input impedance of the entire network 100, Znet is the impedance looking into the network 100, without the quarter wave transformer 150 and Z the characteristic impedance of the quarter wave transformer 150.

According to some embodiments, the quarter wave transforming element 150 is coupled in series with the first reactive element 110.

In some embodiments, the quarter wave transforming element 150 has a characteristic impedance equal to the geometric mean value of the impedance of the arrangement 100 without the quarter wave transforming element 150, for the lowest and highest value of the variable capacitance of the at least one variable capacitive element 130.

The characteristic impedance of the quarter wave transforming element 150 may thus be chosen as the geometric mean value of the input impedance tuning range of network 100 less the quarter wave transformer. This choice inverts the input impedance in a symmetric manner mirroring the high and low end of the tuning range.

The quarter wave transforming element 150 may according to some embodiments comprise a plurality of quarter wave transforming elements 150.

According to some embodiments, the load modulation arrangement 100 comprises the first reactive element 110 and the second reactive element 120, coupled in series. Further, the load modulation arrangement 100 may comprise the at least one variable capacitive element 130. The at least one variable capacitive element 130 may be coupled to the first reactive element 110 and the second reactive element 120. Further, the quarter wave transforming element 150 may be coupled in series with the first reactive element 110.

According to some embodiments, the load modulation arrangement 100 comprises a T network.

A major advantage with using a quarter wave transforming element 150 in an arrangement 100 is the lower power dissipation in the tuning element at high power levels.

According to some embodiments, the value of the first reactive element 110 is selected such that the imaginary impedance of the arrangement 100 is zero for the tuning range ends.

Figure 2:
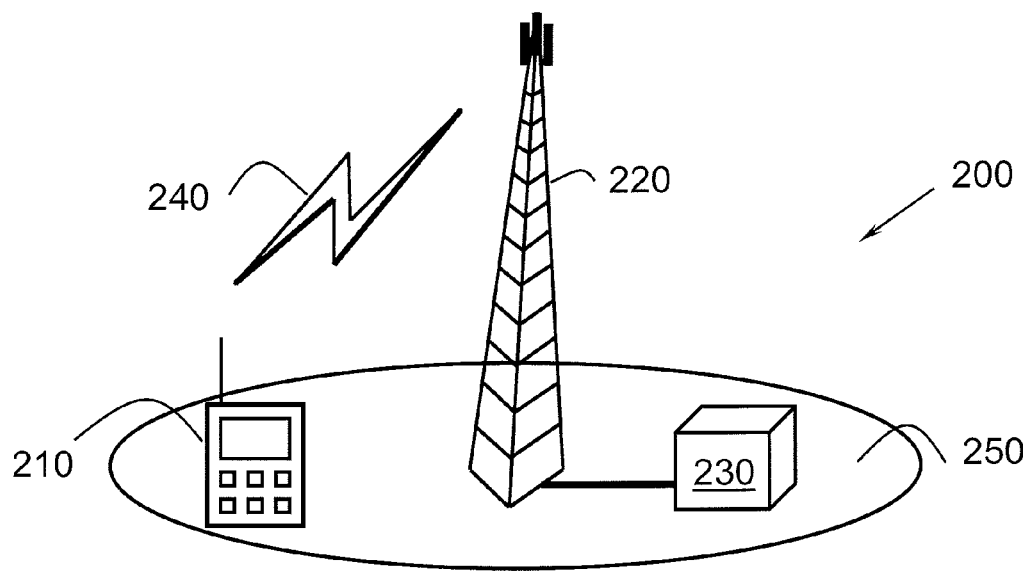
FIG. 2 is a block diagram illustrating embodiments of a wireless communication network.

FIG. 2 depicts a first node 220 communicating with a second node 210 in a wireless communication network 200. The communication between the first node 220 and the second node 210 is made over a radio link 240 in a cell 250 comprised in the wireless communication network 200. The wireless communication network 200 may also comprise a radio network controller 230.

The first node 220 and the second node 210 may both be referred to as radio transmission devices. In some embodiments, the first node 220 may be represented by a base station, a wireless communications station, a fixed station, a control station, a repeater or any similar arrangement for radio communication. The second node 210 may in some embodiments be represented by a user equipment such as a mobile cellular radiotelephone, a Personal Digital Assistant (PDA), a laptop, a computer or any other kind of device capable of communicate radio resources.

The wireless communication network 200 may be based on technologies such as e.g. Code division multiple access (CDMA), Wideband Code Division Multiple Access (WCDMA), CDMA 2000, High Speed Downlink Packet Data Access (HSDPA), High Speed Uplink Packet Data Access (HSUPA), High Data Rate (HDR) etc.

Any or both of the radio transmission devices 210, 220 may comprise at least one load modulation arrangement 100 for load modulation of signals according to the present arrangement 100. The radio transmission devices 210, 220 may be e.g. a wireless access point 220 or a wireless terminal 210.

The load modulation arrangement 100 as herein described may however alternatively be provided in an arbitrary electronic device wherein there appear a need of load modulation of signals, such as a hearing aid, wireless speakers, notebook computers, walkie-talkies, hunting radios, baby monitors etc.

An advantage of the present arrangement 100 may be that it provides a load modulation network which is uncomplicated to implement.

Another advantage of the present load modulation arrangement 100 is that it may increase the efficiency of a power amplifier at backed off conditions, at least regarding the output power.

Figure 3:
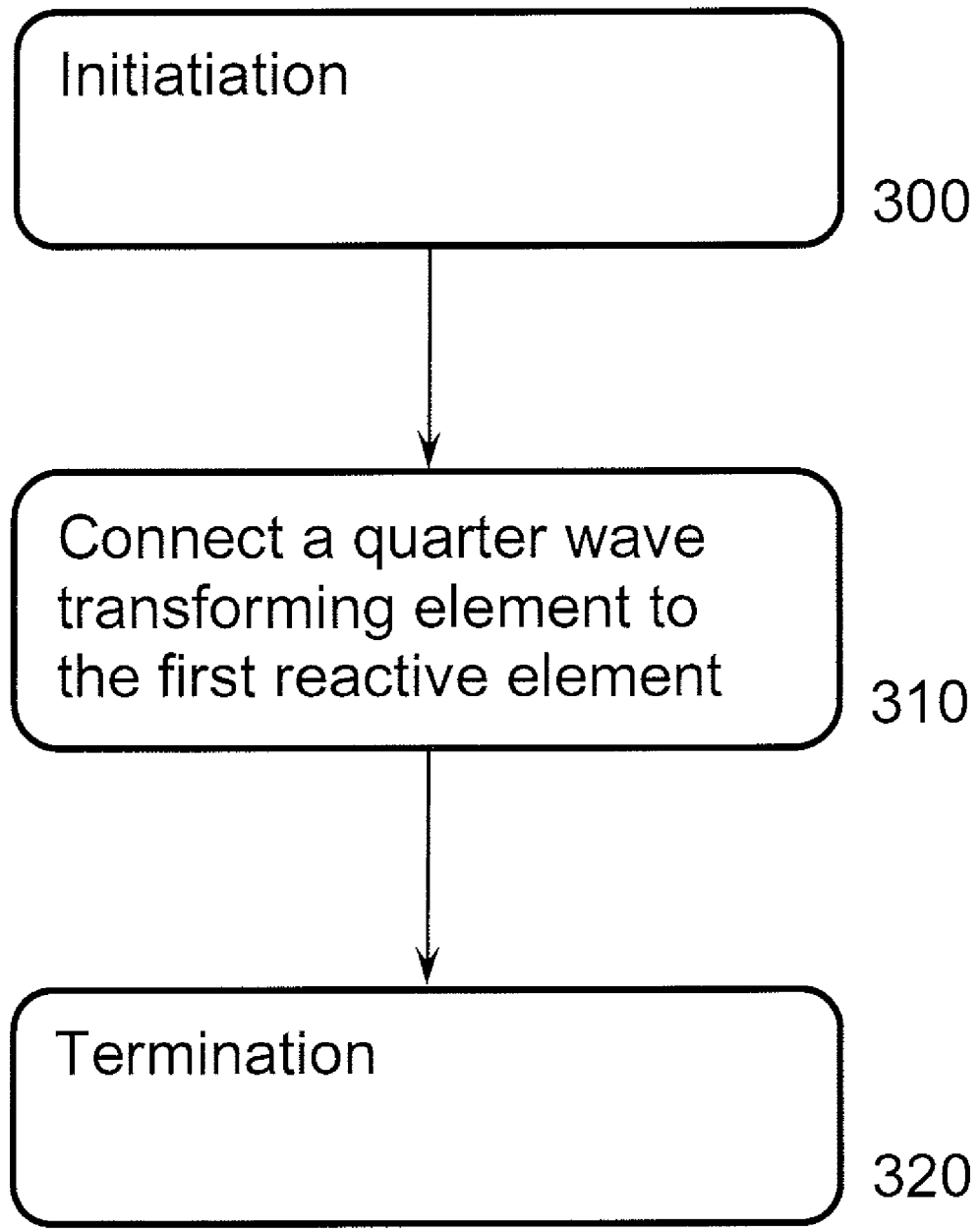
FIG. 3 is a block diagram illustrating embodiments of a method for load modulation.

FIG. 3 schematically illustrates a method for load modulation according to some embodiments. The load modulation is performed in an arrangement 100. The arrangement 100 is adapted to be connected to an amplifying device. The load modulation arrangement 100 comprises a first reactive element 110, a second reactive element 120 and at least one variable capacitive element 130. Also, the method comprises the further step of connecting 310 a quarter wave transforming element 150 to the first reactive element 110.

The present load modulation arrangement 100 may further be designed by a methodology comprising four steps:

Step 1

Determine the maximum usable range of capacitance of the at least one variable capacitive element 130.

Step 2

Select the second reactive element 120 to set the dynamic range of the impedance seen looking into the network 100. The real impedance transformation is only dependant on the values of the at least one variable capacitive element 130 and the reactive element 120.

Step 3

Select the first reactive element 110 to make the impedance seen looking into the network 100 purely resistive, for the endpoints of the tuning range i.e. when the at least one variable capacitive element 130 highest and lowest value.

Step 4

Compute the geometric mean of the impedance seen into the network 100 without the quarter wave transformer 150, for the largest and smallest value of the tunable capacitance of the at least one variable capacitive element 130. This value may with certain advantage be used for the characteristic impedance of the quarter wave transformer.

The present arrangement 100 relates to a load modulation network that may be used advantageously for wireless communication in a plurality of communication situations in a wireless communication network.

While the load modulation arrangement 100 described in this document is susceptible to various modifications and alternative forms, specific embodiments thereof are shown by way of example in the drawings and are herein described in detail. It should be understood, however, that there is no intent to limit the present arrangement 100 to the particular forms disclosed, but on the contrary, the present device is to cover all modifications, equivalents, and alternatives falling within the spirit and scope of the load modulation arrangement 100 as defined by the claims.

Like reference numbers signify like elements throughout the description of the figures.

As used herein, the singular forms "a," "an," and "the" are intended to include the plural forms as well, unless expressly stated otherwise. It should be further understood that the terms "comprises" and/or "comprising" when used in this specification is taken to specify the presence of stated features, integers, steps, operations, elements, and/or components, but does not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present.

Furthermore, "connected" or "coupled" as used herein may include wirelessly connected or coupled. As used herein, the term "and/or" includes any and all combinations of one or more of the associated listed items.

Unless otherwise defined, all terms including technical and scientific terms used herein have the same meaning as commonly understood by one of ordinary skill in the art to which these methods and arrangements belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The invention claimed is:

1. A load modulation arrangement adapted to be connected to an amplifying device, said load modulation arrangement comprising:
    a first reactive element,
    a second reactive element,
    at least one variable capacitive element, wherein the first and second reactive elements are electrically connected to the at least one variable capacitive element, and
    a quarter wave transforming element to connect to the first reactive element, wherein the quarter wave transforming element has a characteristic impedance equal to a geometric mean value of an impedance of the load modulation arrangement, without the quarter wave transforming element, for a lowest and highest value, respectively, of a variable capacitance of the at least one variable capacitive element.

2. The load modulation arrangement according to claim 1, where the quarter wave transforming element is coupled in series with the first reactive element.

3. The load modulation arrangement according to claim 1, where at least one of the first reactive element or the second reactive element is represented by an inductor.

4. The load modulation arrangement according to claim 1, where at least one of the first reactive element or the second reactive element is represented by a transmission line.

5. The load modulation arrangement according to claim 1, where the at least one variable capacitive element is represented by a transistor output capacitance.

6. The load modulation arrangement according to claim 1, where the at least one variable capacitive element is represented by a varactor diode.

7. The load modulation arrangement according to claim 1, where a Radio Frequency (RF) voltage amplitude over the variable capacitive element decreases for increasing values of capacitance of the variable capacitive element, and where the RF voltage amplitude over the variable capacitive element increases for decreasing values of capacitance of the capacitive element.

8. The load modulation arrangement according to claim 1, where the load modulation arrangement comprises a T network.

9. A load modulation arrangement adapted to be connected to an amplifying device, said load modulation arrangement comprising:
    a first reactive element,
    a second reactive element,
    at least one variable capacitive element, wherein the first and second reactive elements are electrically connected to the at least one variable capacitive element, and
    a quarter wave transforming element to connect to the first reactive element,
    where a value of the first reactive element is selected such that an imaginary impedance of the load modulation arrangement is zero for ends of a tuning range.

10. A method for load modulation in an arrangement adapted to be connected to an amplifying device, the method comprising:
    providing a first reactive element, a second reactive element and at least one variable capacitive element that are electrically connected, and
    connecting a quarter wave transforming element to the first reactive element, wherein the quarter wave transforming element has a characteristic impedance equal to a geometric mean value of an impedance of the load modulation arrangement, without the quarter wave transforming element, for a lowest and highest value, respectively, of a variable capacitance of the at least one variable capacitive element.

11. A radio transmission device comprising:
    at least one load modulation arrangement including:
        a first reactive element,
        a second reactive element,
        at least one variable capacitive element, wherein the first and second reactive elements are electrically connected to the at least one variable capacitive element, and
        a quarter wave transforming element to connect to the first reactive element, wherein the quarter wave transforming element has a characteristic impedance equal to a geometric mean value of an impedance of the load modulation arrangement, without the quarter wave transforming element, for a lowest and highest value, respectively, of a variable capacitance of the at least one variable capacitive element.

12. The radio transmission device according to claim 11, where the radio transmission device is a wireless access point.

13. The radio transmission device according to claim 11, where the radio transmission device is a wireless terminal.

14. The radio transmission device according to claim 11, where the quarter wave transforming element is coupled in series with the first reactive element.

15. The radio transmission device according to claim 11, where at least one of the first reactive element or the second reactive element is represented by an inductor.

16. The radio transmission device according to claim 11, where at least one of the first reactive element or the second reactive element is represented by a transmission line.

17. The radio transmission device according to claim 11, where the at least one variable capacitive element is represented by a transistor output capacitance.

18. A radio transmission device comprising:
at least one load modulation arrangement including:
- a first reactive element,
- a second reactive element,
- at least one variable capacitive element, wherein the first and second reactive elements are electrically connected to the at least one variable capacitive element, and a quarter wave transforming element to connect to the first reactive element, where a value of the first reactive element is selected such that an imaginary impedance of the load modulation arrangement is zero for ends of a tuning range.

* * * * *